US007583107B2

(12) United States Patent
Pratlong et al.

(10) Patent No.: US 7,583,107 B2
(45) Date of Patent: Sep. 1, 2009

(54) SENSE AMPLIFIER CIRCUIT FOR LOW VOLTAGE APPLICATIONS

(75) Inventors: Jerome Pratlong, Chelmsford (GB);
Marc Merandat, Bouc Bel Air (FR);
Stephane Ricard, Bouc Bel Air (FR);
Sylvie Bruneau Vergnes, Trets (FR);
Laureline Bour, Pourrieres (FR)

(73) Assignee: Atmel Corporation, San Jose, CA (US)

( * ) Notice: Subject to any disclaimer, the term of this patent is extended or adjusted under 35 U.S.C. 154(b) by 46 days.

(21) Appl. No.: 11/527,840

(22) Filed: Sep. 27, 2006

(65) Prior Publication Data
US 2008/0074152 A1    Mar. 27, 2008

(51) Int. Cl.
*G01R 19/00* (2006.01)
(52) U.S. Cl. ............... 327/51; 327/538; 365/189.07
(58) Field of Classification Search ............ 327/50, 327/51; 365/189.07
See application file for complete search history.

(56) References Cited

U.S. PATENT DOCUMENTS

| 5,272,674 | A  |    | 12/1993 | Pathak et al. |
|-----------|----|----|---------|---------------|
| 5,541,526 | A  |    | 7/1996  | Sandhu |
| 5,754,010 | A  | *  | 5/1998  | Caravella et al. ............ 365/203 |
| 5,828,239 | A  |    | 10/1998 | Lotfi |
| 6,205,070 | B1 |    | 3/2001  | Seevinck |
| 6,349,060 | B1 | *  | 2/2002  | Ogura ................ 365/185.21 |
| 6,483,351 | B2 |    | 11/2002 | Sim |
| 6,693,415 | B2 |    | 2/2004  | Johnson |
| 6,798,250 | B1 | *  | 9/2004  | Wile ...................... 327/51 |
| 6,836,155 | B2 |    | 12/2004 | Shim |
| 7,260,004 | B2 | *  | 8/2007  | Lamorey et al. ............ 365/201 |
| 2002/0036536 | A1 | * | 3/2002 | Wada et al. ................ 327/538 |
| 2002/0050855 | A1 | * | 5/2002 | Nagaya et al. ............. 327/541 |
| 2002/0060939 | A1 | * | 5/2002 | Kuo et al. .................. 365/207 |
| 2003/0142568 | A1 | * | 7/2003 | Giove et al. ................ 365/207 |
| 2003/0210078 | A1 |    | 11/2003 | Wijetunga et al. |
| 2004/0047099 | A1 | * | 3/2004 | Pippin .................... 361/103 |
| 2005/0169077 | A1 |    | 8/2005  | Balasubramanian et al. |
| 2005/0276116 | A1 | * | 12/2005 | Ide et al. ............... 365/185.22 |
| 2006/0077709 | A1 | * | 4/2006  | Frulio et al. ............. 365/185.2 |

FOREIGN PATENT DOCUMENTS

WO    WO-2008/039624 A3    4/2008

* cited by examiner

*Primary Examiner*—Lincoln Donovan
*Assistant Examiner*—Ryan C Jager
(74) *Attorney, Agent, or Firm*—Schwegman, Lundberg & Woessner P.A.

(57) ABSTRACT

A sense amplifier circuit for low voltage applications is provided. In one implementation, the sense amplifier circuit includes a reference current generation circuit coupled to a power supply. The reference current generation circuit generates a reference current that varies linearly with respect to changes in voltages of the power supply. The sense amplifier circuit further includes a sensing circuit coupled to the reference current generation circuit. The sensing circuit senses an amplitude of a current based at least on part on the reference current.

19 Claims, 4 Drawing Sheets

SENSE AMPLIFIER CIRCUIT FOR LOW VOLTAGE APPLICATIONS

FIELD OF THE INVENTION

The present invention relates generally to digital circuits, and more particularly to sense amplifier circuits.

BACKGROUND OF THE INVENTION

A sense amplifier circuit is an integrated circuit that is typically used to measure the amplitude and direction of current in a digital circuit. A sense amplifier circuit can be used within a number of different digital circuit applications. For example, a sense amplifier circuit can be used to read out data stored in an EEPROM (electrically erasable programmable read-only memory).

FIG. 1 shows a conventional sense amplifier circuit 100 including a sensing circuit 102 for sensing a bit from a memory cell 104 to extract a value stored within the memory cell 104. If the bit within the memory cell 104 has been erased (e.g., logic 1), then the current Icell delivered by the memory cell 104 is zero. If the bit within the memory cell 104 has been previously written to (e.g., logic 0), then the current Icell is not zero (e.g., 15 µA). The sensing circuit 102 compares the current Icell to a threshold current Ithr (which can be, for example, 5 µA). If the current Icell is lower than the threshold current Ithr, then the node ($D_{OUT}$) goes high. In an opposite manner, if the current Icell is higher than the threshold current Ithr, then the node ($D_{OUT}$) goes low. The limitation, however, of the sense amplifier circuit 100 is that the threshold current Ithr varies nonlinearly—e.g., as a square law—with respect to the supply voltage $V_{DD}$. Such a nonlinear behavior can causes the current threshold Ithr to become very low at low supply voltage levels (e.g., $V_{DD}$ near 0V) which can drastically increase access time of the memory cell 102. Likewise, the current threshold Ithr can be become too high at high supply voltage levels (e.g., $V_{DD}$ near 2V), which can cause the sense amplifier circuit 100 to fail.

BRIEF SUMMARY OF THE INVENTION

In general, in one aspect, this specification describes a sense amplifier circuit including a reference current generation circuit coupled to a power supply. The reference current generation circuit generates a reference current that varies linearly with respect to changes in voltages of the power supply. The sense amplifier circuit further includes a sensing circuit coupled to the reference current generation circuit. The sensing circuit senses an amplitude of a current based at least on part on the reference current.

Particular implementations can include one or more of the following features. The voltage of the power supply can be determined by a difference between a high supply voltage and a low supply voltage. The sense amplifier circuit can include only standard CMOS (complementary metal oxide semiconductor) transistors. The sensing circuit can sense the amplitude of the current by comparing the current to the reference current. The comparison between the current and the reference current can be an indirect comparison. The sense amplifier circuit can further include a bandgap circuit coupled to a gate of a transistor associated with the reference current generation circuit. The bandgap circuit can control the reference current through the transistor. The current sensed by the sensing circuit can be a current associated with a memory cell. The memory cell can comprise an EEPROM (electrically erasable programmable read-only memory) or a FLASH memory.

In general, in another aspect, this specification describes a system comprising a circuit including a measurable current, and a sense amplifier circuit as discussed above. The sense amplifier circuit senses an amplitude of the measurable current and generate an output corresponding to the sensed amplitude.

Particular implementations can include one or more of the following features. The system can comprise one or more of a microcontroller, memory, logic, radio frequency (RF) component, or sensor.

In general, in another aspect, this specification describes a sense amplifier circuit operable to sense an amplitude of a current associated with a digital circuit. The sense amplifier circuit includes a reference current generation circuit coupled between a high supply voltage and a low supply voltage. The reference current generation circuit generates a reference current that varies linearly with respect to changes in a voltage difference between the high supply voltage and the low supply voltage. The sense amplifier circuit further includes a sensing circuit coupled between the high supply voltage and the low supply voltage. The sensing circuit senses an amplitude of a current of a digital circuit based at least in part on the reference current.

In general, in another aspect, this specification describes a method for sensing an amplitude of a current in a circuit. The method includes generating a reference current that varies linearly with respect to changes in voltages of a power supply, and sensing an amplitude of the current associated with the circuit based at least on part on the reference current.

Particular implementations can include one or more of the following features. Sensing an amplitude of the current can include sensing an amplitude of the current by comparing the current to the reference current. The comparison between the current and the reference current can be an indirect comparison.

Implementations may provide one or more of the following advantages. In one aspect, a sense amplifier circuit is provided that contains a wide voltage supply range functionality. In another aspect, a sense amplifier circuit is provided that contains a low supply voltage functionality at speed.

The details of one or more implementations are set forth in the accompanying drawings and the description below. Other features and advantages will be apparent from the description and drawings, and from the claims.

BRIEF DESCRIPTION OF SEVERAL VIEWS OF THE DRAWINGS

Like reference symbols in the various drawings indicate like elements.

DETAILED DESCRIPTION OF THE INVENTION

The present invention relates generally to digital circuits, and more particularly to sense amplifier circuits. The following description is presented to enable one of ordinary skill in the art to make and use the invention and is provided in the context of a patent application and its requirements. Various modifications to the preferred implementations and the generic principles and feature described herein will be readily apparent to those skilled in the art. Thus, the present invention is not intended to be limited to the implementations shown but is to be accorded the widest scope consistent with the principles and features described herein.

Figure 1:
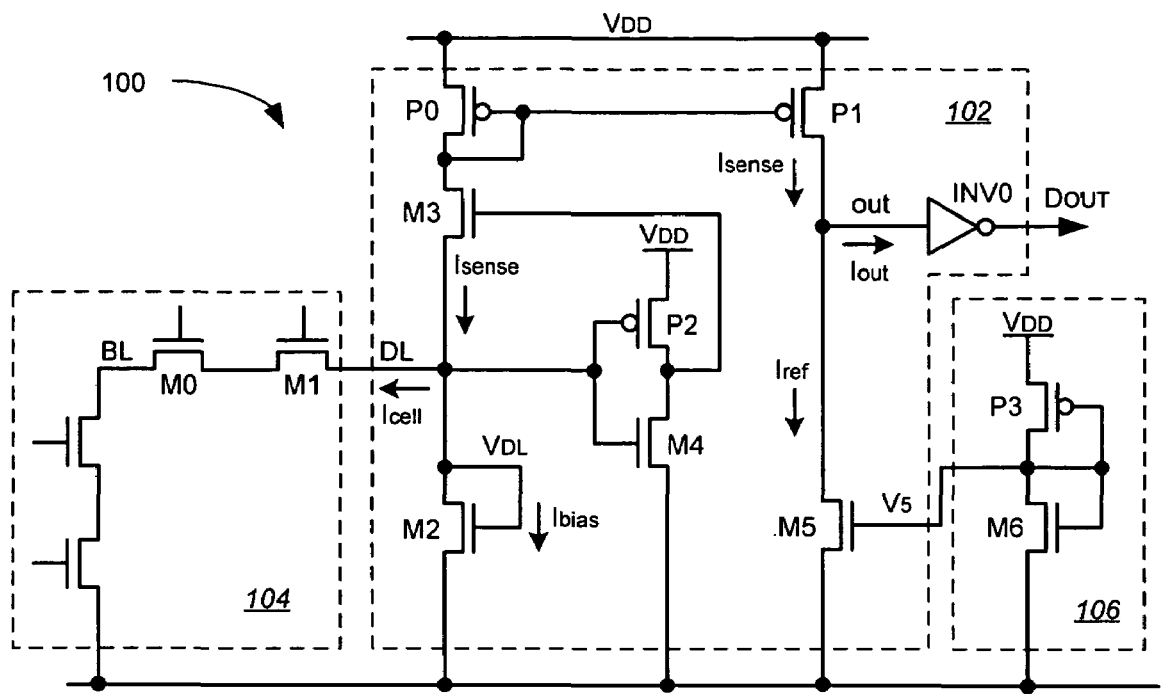
FIG. 1 is a block diagram of a conventional sense amplifier circuit.

Referring again to FIG. 1, in order for current to be extracted from the memory cell 104, the memory cell 104 is biased—i.e., the bit line (BL) node is pre-charged to a value of (e.g.) 0.8V. The pre-charged bit line allows to get enough drain to source voltage on the memory cell 104 so that it is able to deliver some amount of current if it is ON. To sense the current Icell and to pre-charge the bit line node, a regulated cascode circuit is implemented The cascode circuit is composed of transistors P0, M3, M2, P2, and M4. The threshold voltage of the inverter formed by transistors P2 and M4 sets the value of the voltage on the bit line node. The cascode circuit is biased with a bias current Ibias via transistor M2. Accordingly, the current Isense sensed from the memory cell 104 can be expressed as follows:

$$I_{sense} = I_{bias} + I_{cell} \quad \text{(eq. 1)}$$

The current Isense is mirrored from transistor P0 to transistor P1 without any factor (due to the transistors P0 and P1 having the same size or W/L ratio). The current Isense is compared to a reference current Iref generated from a reference current generation circuit 106 composed of a voltage divider formed by transistors P3 and M6. The reference current Iref is mirrored through transistor M5 for the comparison with the current Isense.

The threshold current Ithr is defined as:

$$I_{thr} = I_{ref} - I_{bias} \quad \text{(eq. 2)}$$

and the output current Iout is given by the following equation:

$$I_{out} = I_{sense} - I_{ref} \quad \text{(eq. 3)}$$

Inserting equations (1) and (2) into equation (3) above results in the following:

$$I_{out} = I_{cell} - I_{thr} \quad \text{(eq. 4)}$$

Accordingly, based on equation (4) above, if the current Icell is greater than the threshold current Ithr then the current Iout is positive, and the voltage at the output node (out) goes high, and the node ($D_{OUT}$) goes low (logic 0). Likewise, if the current Icell is less that the threshold current Ithr then the current Iout is negative, and the voltage at the output node (out) goes low, and the node ($D_{OUT}$) goes high (logic 1).

The expression of the threshold current Ithr in relation to the supply voltage VDD is given as follows:

$$I_{thr} = K_N * \left[ \frac{W_5}{L_5} * (V_5 - V_{TN})^2 - \frac{W_2}{L_2} * (V_{DL} - V_{TN})^2 \right] \quad \text{(eq. 5)}$$

where the voltages V5 and VDL are given, respectively, by the voltage dividers formed by transistors P3/M6 and P2/M4. To simplify equation 5, the voltage dividers can be considered to be equal (which does not necessarily have to be the case). Thus, dividing by a factor of α, equation (5) reduces to the following:

$$I_{thr} = K_N * \left[ \frac{W_5}{L_5} - \frac{W_2}{L_2} \right] * \left( \frac{V_{DD}}{\alpha} - V_{TN} \right)^2 \quad \text{(eq. 6)}$$

Figure 2:
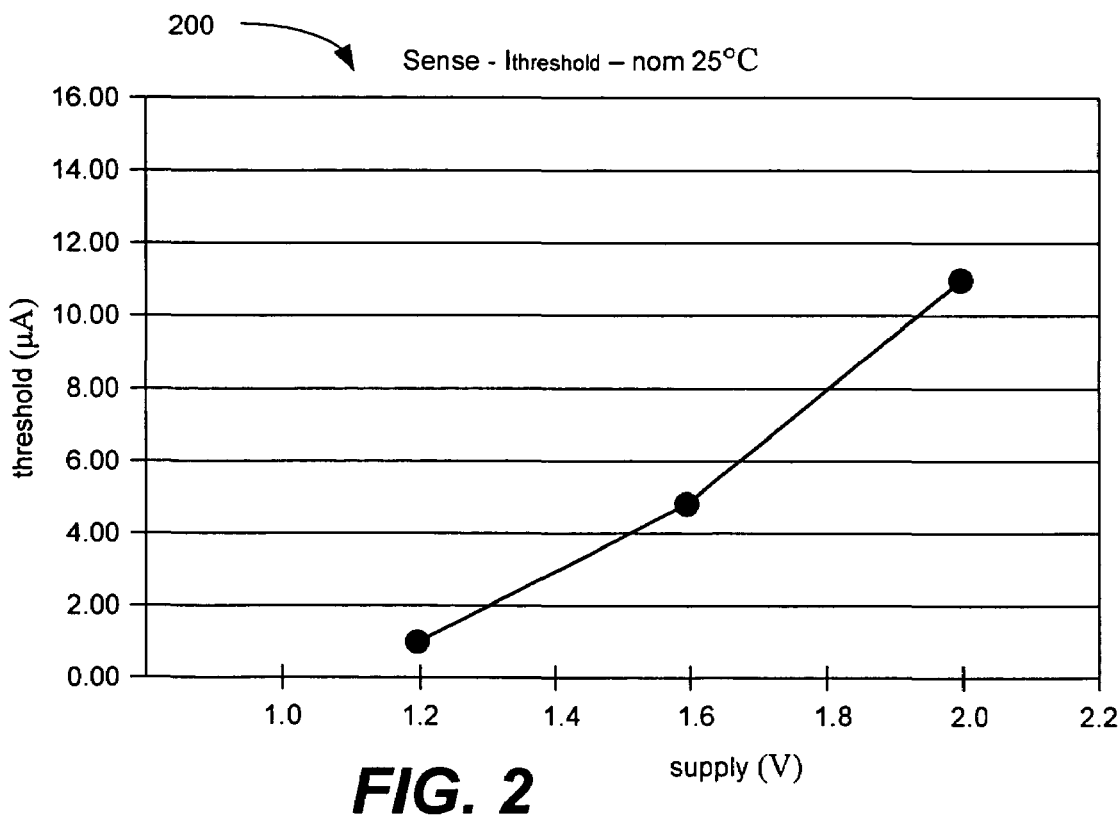
FIG. 2 is a graph of the threshold current Ithr associated with the sense amplifier circuit of FIG. 1 relative to supply voltage $V_{DD}$.

The above expression illustrates the square law of the threshold current Ithr versus the supply voltage $V_{DD}$. A simulation of the threshold current Ithr is illustrated in FIG. 2. As shown in FIG. 2, the threshold current Ithr nears zero at lower $V_{DD}$ (high) supply voltage levels. Such a poor threshold current Ithr at low supply voltages can drastically increase memory access times and, therefore, limit the overall application.

Figure 3:
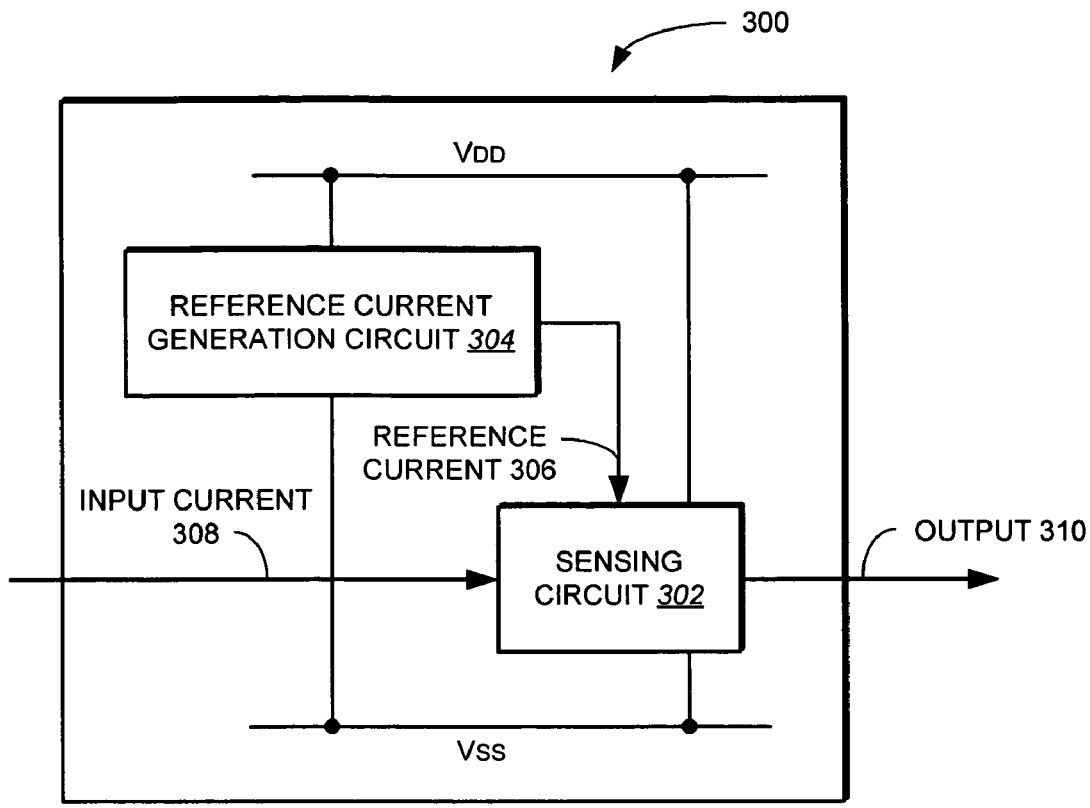
FIG. 3 is a block diagram of a sense amplifier circuit in accordance with one implementation.

FIG. 3 illustrates a sense amplifier circuit 300 in accordance with one implementation. The sense amplifier circuit 300 includes a sensing circuit 302 and a reference current generation circuit 304. In one implementation, the sensing circuit 302 and the reference current generation circuit 304 are composed of standard CMOS (complementary metal oxide semiconductor) transistors. In one implementation, the sensing circuit 302 and the reference current generation circuit 304 are coupled between a high supply $V_{DD}$ and a low supply $V_{SS}$. In one implementation, the reference current generation circuit 306 generates a reference current (e.g., reference current 306) that varies linearly with respect to changes in the supply voltage. Generally, the reference current generation circuit 306 generates a reference current that varies linearly with respect to changes in a voltage difference between the high supply voltage $V_{DD}$ and the low supply voltage $V_{SS}$. In one implementation, the sensing circuit 302 senses an amplitude of an input current 308 by comparing the input current 308 to the reference current 306, and generates an output 310 (e.g., an output voltage) corresponding to the amplitude of the input current 308, compared to reference current 306. Accordingly, because the reference current 306 varies linearly with respect to changes in the high supply voltages, the sense amplifier circuit 300 can provide better performance across a wider range of supply voltages as compared to conventional sense amplifier circuits.

Figure 4:
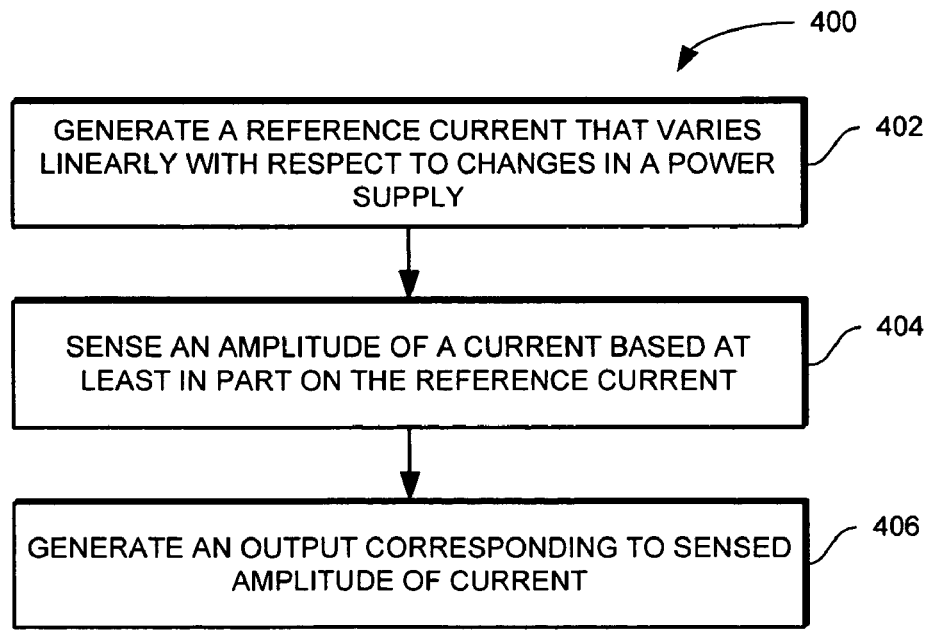
FIG. 4 is a method for sensing an amplitude of a current in accordance with one implementation.

FIG. 4 shows a method 400 for sensing an amplitude of a current (e.g., input current 308) using a sense amplifier circuit (e.g., sense amplifier circuit 300) in accordance with one implementation. A reference current that varies linearly with respect to changes in a supply voltage is generated by a reference current generation circuit (e.g., reference current generation circuit 304) (step 402). In one implementation, a reference current is generated that varies linearly with respect to changes in a voltage difference between the high supply voltage $V_{DD}$ and the low supply voltage $V_{SS}$ coupled to the reference current generation circuit. An amplitude of a current is sensed by a sensing circuit (e.g., sensing circuit 302) based at least in part on the reference current (step 404). In one implementation, the sensing circuit senses an amplitude of the current by comparing the current to the reference current. In one implementation, the comparison between the current and the reference current is an indirect comparison—e.g., a threshold current Ithr can be defined based on the reference current Iref (as discussed above), and the threshold current Ithr can be compared with the current. An output is generated by the sensing circuit that corresponds to the sensed amplitude of the current (step 406).

Figure 5:
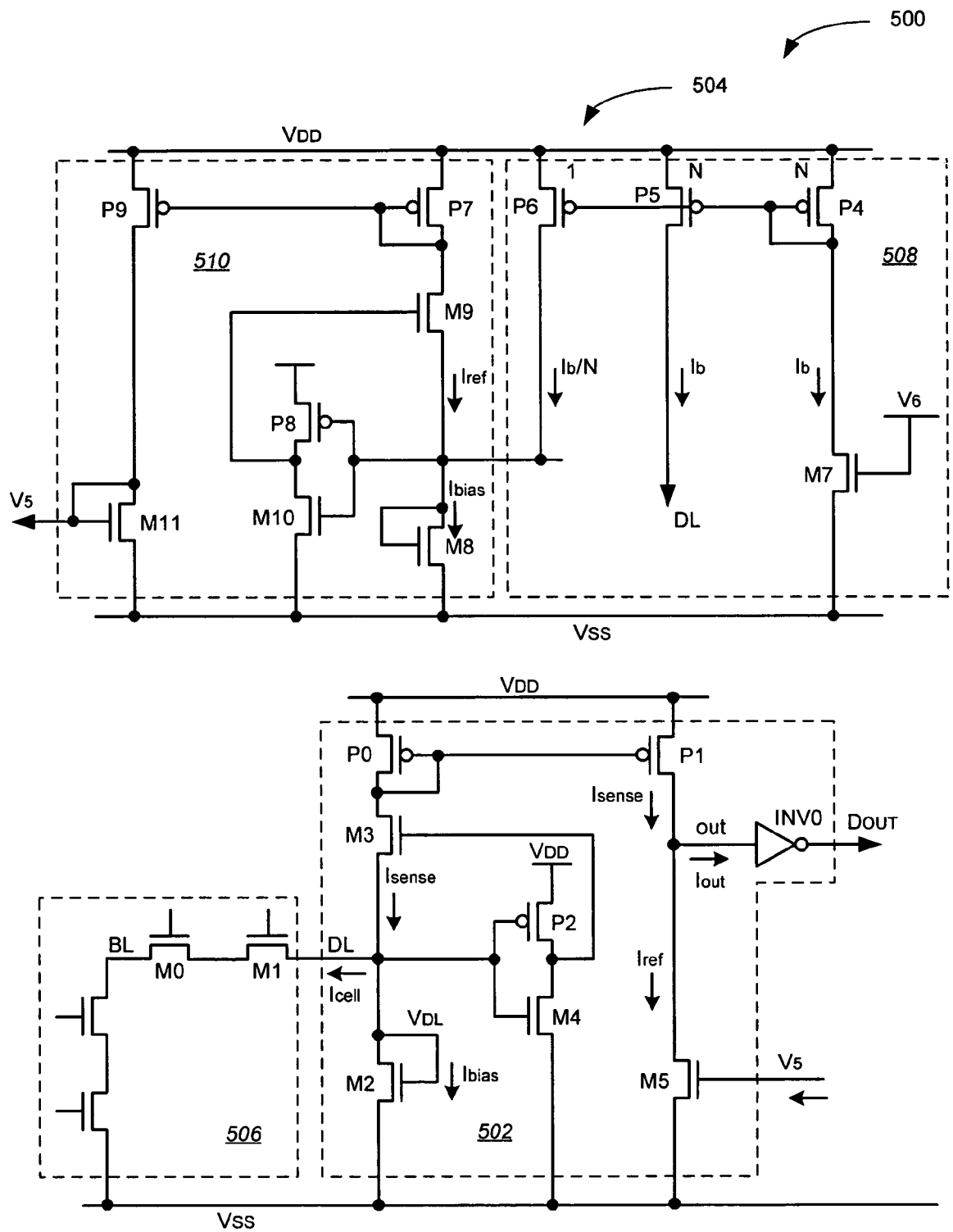
FIG. 5 is a schematic diagram of a sense amplifier circuit in accordance with one implementation.

FIG. 5 illustrates a schematic diagram of one implementation of a sensing amplifier circuit 500. The sensing amplifier circuit 500 includes a sensing circuit 502 and a reference current generation circuit 504. The reference current generation circuit 504 generates a reference current Ib that varies linearly with respect to changes in the high supply voltage $V_{DD}$. In one implementation, the reference current generation circuit 504 includes a first circuit 508 that generates a current that varies linearly with respect to changes in high supply voltages, and includes a second circuit 510 that generates a reference replica More in detail, the reference current Ib is provided by transistor M7 (and P4) and is linear with respect to supply voltage. The circuit 510 is a cascode circuit replica (as cascade circuit using P0, M3, M2, P2, M4 discussed above) with Ib/N as input current. The cascode current is given as follows:

$$I_{ref} = I_{bias} - \frac{I_b}{N} \quad \text{(eq. 7)}$$

This Iref current is mirrored through transistors P7 and P9 and then through transistors M11 and M5. Thus, the current flowing through transistor M5 is also given by equation (7) above. On the other hand, the current Ib provided by transistor P5 is added on DL net, so, the current Isense is given as follows:

$$I_{sense} = I_{bias} + I_{cell} - I_b, \quad \text{(eq. 8)}$$

and equation (2) above becomes:

$$I_{thr} = I_b \left(1 - \frac{1}{N}\right), \quad \text{(eq. 9)}$$

which is linear with Vdd as the current Ib is. The sensing circuit 502 senses an amplitude of a current Icell from the memory cell 506 by comparing the current Icell to the reference current Iref Though, the sensing circuit 502 is shown in FIG. 5 as sensing an amplitude of a current associated with a memory cell 506, the sensing circuit 502 can be used to sense an amplitude of a current of any type of circuit as discussed in greater detail below.

In one implementation, in order to have the threshold current Ithr independent of the supply voltage, a bandgap circuit (not shown) could be used to control the gate of transistor M7. In another implementation, a voltage reference that is stable over a range of supply voltages can be implemented to control the gate of transistor M7. One example of such a voltage reference is described in co-pending patent application entitled "Method and System For Providing A Charge Pump Circuit For Low Voltage Applications", application Ser. No. 11/440,501, filed on May 24, 2006, which is incorporated herein by reference.

Figure 6:
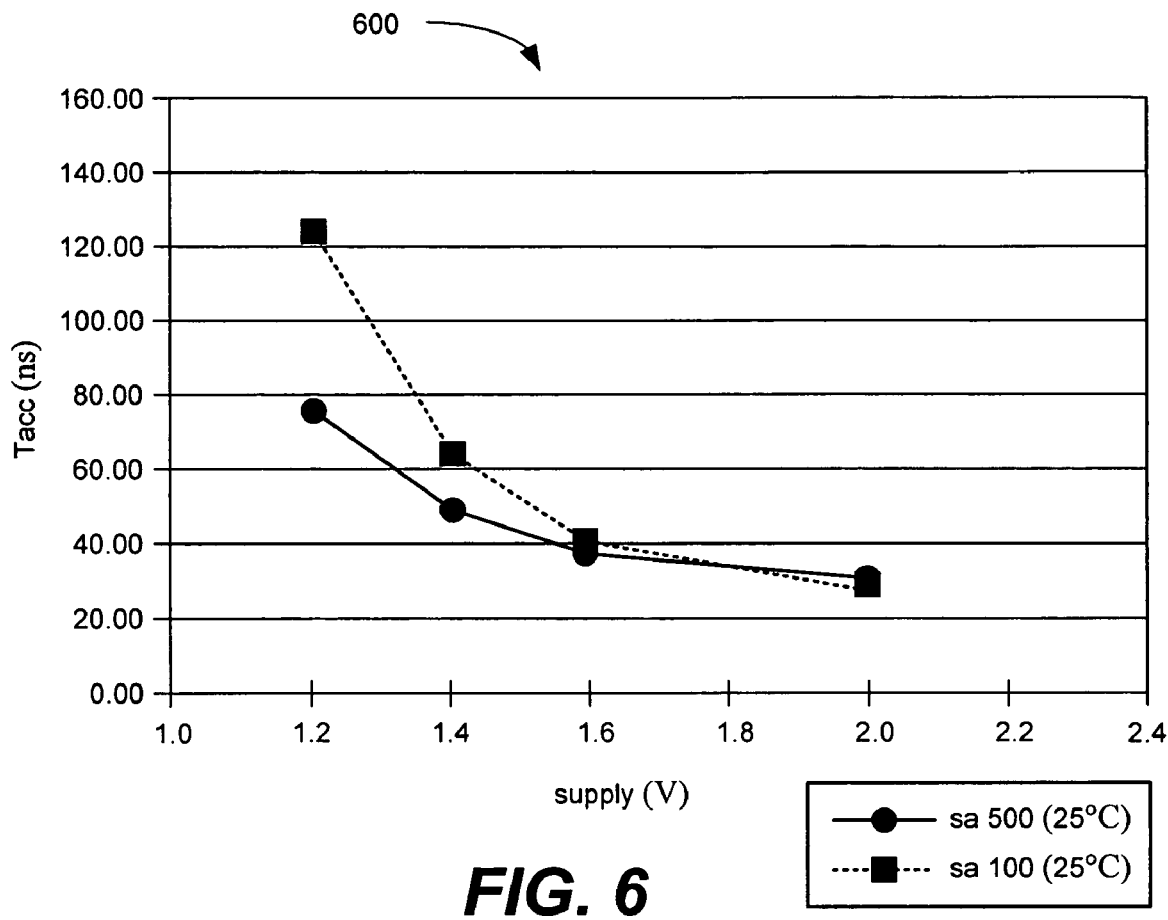
FIG. 6 is a graph illustrating access times of a memory cell.

FIG. 6 illustrates a graph 600 of access times of a memory cell by the sense amplifier circuit 100 (FIG. 1) and the sense amplifier circuit 500 (FIG. 5). As shown in the graph 600, the sense amplifier circuit 500 has a substantial gain in terms of access time (Tacc) to a memory relative to the conventional sense amplifier circuit 100 at lower supply voltage levels. For example, at 1.2V the sense amplifier circuit 500 has an access time gain of about 63% over the conventional sense amplifier circuit 100 (at 25° C.). Moreover, no great loss in access time of the sense amplifier circuit 500 is observed at higher supply voltage levels (e.g., $V_{DD}$=2.0V).

Figure 7:
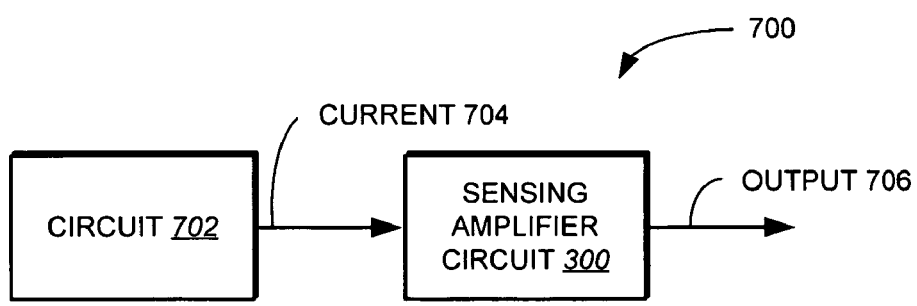
FIG. 7 is a block diagram of a system including the sense amplifier circuit of FIG. 3.

FIG. 7 illustrates a system 700 including the sensing amplifier circuit 300 in accordance with one implementation. The sense amplifier circuit 300 senses a current 704 of a circuit 702. The circuit 702 can be any type of circuit that includes a measureable current. For example, the circuit 702 can be a memory cell (e.g., a EEPROM or a FLASH memory). In general, the system 700 can comprise a microcontroller, memory, logic, radio frequency (RF) component, or sensor.

Various implementations of a sense amplifier circuit have been described. Nevertheless, one or ordinary skill in the art will readily recognize that there that various modifications may be made to the implementations, and any variation would be within the spirit and scope of the present invention. For example, though examples of a sense amplifier circuit described above are generally described with respect to CMOS technologies, a sense amplifier circuit in accordance with the present invention can be implemented using other transistor technologies (e.g., bipolar junction transistors (BJTs) or discrete components). Accordingly, many modifications may be made by one of ordinary skill in the art without departing from the scope of the following claims.

What is claimed is:

1. A sense amplifier circuit comprising:
a reference current generation circuit coupled to a power supply, configured to generate a reference current that varies linearly with respect to changes in voltages of the power supply, and including a replica circuit to generate a replica current, based on the reference current, on a circuit path between a first supply node and a second supply node of the power supply, and a bias transistor in the circuit path, the bias transistor including a gate, a drain coupled to the gate, and a source coupled to the second supply node, the replica circuit further configured to generate a first copy of the replica current, wherein the reference current generation circuit is configured to generate the reference current such that a value of the replica current is equal to a value of a current flowing through the bias transistor minus a value of the reference current; and
a sensing circuit coupled to the reference current generation circuit and configured to generate a second copy of the replica current to sense an amplitude of a current based at least in part on the second copy of the replica current.

2. The sense amplifier circuit of claim 1, wherein the voltage of the power supply is determined by a difference between a high supply voltage and a low supply voltage.

3. The sense amplifier circuit of claim 1, wherein the sense amplifier circuit includes only standard CMOS (complementary metal oxide semiconductor) transistors.

4. The sense amplifier circuit of claim 1, wherein the sensing circuit is configured to sense the amplitude of the current by comparing the current with the second copy of the replica current.

5. The sense amplifier circuit of claim 1, further comprising a bandgap circuit coupled to a gate of a transistor associated with the reference current generation circuit, the bandgap circuit to control the reference current through the transistor.

6. The sense amplifier circuit of claim 1, wherein the amplitude of the current sensed by the sensing circuit is an amplitude of a current associated with a memory cell.

7. The sense amplifier circuit of claim 6, wherein the memory cell comprises an EEPROM (electrically erasable programmable read-only memory) or a FLASH memory.

8. A system comprising:
a circuit including a measurable current; and
a sense amplifier circuit coupled to the circuit to sense an amplitude of the measurable current and generate an output corresponding to the sensed amplitude, the sense amplifier circuit including:
a reference current generation circuit coupled to a power supply, configured to generate a reference current that varies linearly with respect to changes in voltages of the power supply, and including a replica circuit to generate a replica current, based on the reference current, on a circuit path between a first supply node and a second supply node of the power supply, and a bias transistor in the circuit path, the bias transistor including a gate, a drain coupled to the gate, and a source coupled to the second supply node, the replica circuit to further configured to generate a first copy of the replica current, wherein the reference current generation circuit is configured to generate the reference current such that a value of the replica current is equal to a value of a current flowing through the bias transistor minus a value of the reference current; and
a sensing circuit coupled to the reference current generation circuit and configured to generate a second copy of the replica current to sense an amplitude of a current based at least in part on the second copy of the replica current.

9. The system of claim 8, wherein the system comprises one or more of a microcontroller, memory, logic, radio frequency (RF) component, or sensor.

10. A sense amplifier circuit operable to sense an amplitude of a current associated with a digital circuit, the sense amplifier circuit comprising:
a reference current generation circuit coupled between a first supply voltage and a second supply voltage, configured to generate a reference current that varies linearly with respect to changes in a voltage difference between the first supply voltage and the second supply voltage, and including a replica circuit to generate a replica current, based on the reference current, on a circuit path between the first supply voltage and the second supply voltage, and a bias transistor in the circuit path, the bias transistor including a gate, a drain coupled to the gate, and a source coupled to the second supply voltage, the replica circuit further configured to generate a first copy of the replica current, wherein the reference current generation circuit is configured to generate the reference current such that a value of the replica current is equal to a value of a current flowing through the bias transistor minus a value of the reference current; and
a sensing circuit coupled between the first supply voltage and the second supply voltage, and configured to generate a second copy of the replica current and to sense an amplitude of a current of a digital circuit based at least in part on the second copy of the replica current.

11. The sense amplifier circuit of claim 10, wherein all of transistors of the sense amplifier circuit include standard CMOS (complementary metal oxide semiconductor) transistors.

12. The sense amplifier circuit of claim 10, wherein the sensing circuit is configured to sense the amplitude of the current of the digital circuit by comparing the current to the second copy of the replica current.

13. The sense amplifier circuit of claim 12, further comprising a bandgap circuit coupled to a gate of a transistor associated with the reference current generation circuit, and configured to control the reference current through the transistor.

14. The sense amplifier circuit of claim 10, wherein the current sensed by the sensing circuit is a current associated with a memory cell.

15. The sense amplifier circuit of claim 14, wherein the memory cell comprises an EEPROM (electrically erasable programmable read-only memory) or a FLASH memory.

16. A method for sensing an amplitude of a current in a circuit, the method comprising:
generating a reference current that varies linearly with respect to changes in voltages of a power supply;
generating a replica current, based on the reference current, on a circuit path between a first supply node and a second supply node of a replicate circuit, wherein generating the replica current includes biasing a bias transistor in the circuit path, the bias transistor including a gate, a drain coupled to the gate, and a source coupled to the second supply node, the replica circuit further configured to generate a first copy of the replica current, wherein a value of the replica current is equal to a value of a current flowing through the bias transistor minus a value of the reference current; and
sensing an amplitude of the current associated with the circuit based at least in part on a second copy of the replica current.

17. The method of claim 16, wherein sensing an amplitude of the current includes sensing an amplitude of the current by comparing the current with the reference current.

18. A sense amplifier circuit comprising:
a reference current generation circuit coupled to a power supply, configured to generate a reference current that varies linearly with respect to changes in voltages of the power supply, and including a replica circuit to generate a replica current, based on the reference current, on a circuit path between a first supply node and a second supply node of the power supply, and a bias transistor in the circuit path, the bias transistor including a gate, a drain coupled to the gate, and a source coupled to the second supply node, wherein the
replica circuit further includes an additional transistor coupled between the bias transistor and the first supply node, and an inverter including an inverter input node coupled to the gate and the drain of the bias transistor and an inverter output node coupled to the gate of the additional transistor, wherein the reference current generation circuit is configured to generate the reference current such that a value of the replica current is equal to a value of a current flowing through the bias transistor minus a value of the reference current; and
a sensing circuit coupled to the reference current generation circuit and configured to sense an amplitude of a current based at least in part on the replica current.

19. A method for sensing an amplitude of a current in a circuit, the method comprising:
generating a reference current that varies linearly with respect to changes in voltages of a power supply;
generating a replica current, based on the reference current, on a circuit path between a first supply node and a second supply node of a replicate circuit, wherein generating the replica current includes biasing a bias transistor in the circuit path, the bias transistor including a gate, a drain coupled to the gate, and a source coupled to the second supply node, wherein generating the replica current includes passing the replica current through an additional transistor in the circuit path, and wherein a gate of the additional transistor is controlled by an inverter that is coupled between the gate of the additional transistor and the gate and the drain of the bias transistor, wherein the reference current is generated such that a value of the replica current is equal to a value of a current flowing through the bias transistor minus a value of the reference current; and sensing an amplitude of the current associated with the circuit based at least in part on the replica current.

* * * * *